(12) United States Patent
Nallavelli et al.

(10) Patent No.: US 12,438,113 B2
(45) Date of Patent: Oct. 7, 2025

(54) CONDUCTIVE ADHESIVE ASSEMBLY FOR SEMICONDUCTOR DIE ATTACHMENT

(71) Applicant: Micron Technology, Inc., Boise, ID (US)

(72) Inventors: Ramesh Nallavelli, Sangareddy (IN); Nagavenkata Varaprasad Nune, Hyderabad (IN); Yeow Chon Ong, Toa Payoh (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 497 days.

(21) Appl. No.: 17/890,734

(22) Filed: Aug. 18, 2022

(65) Prior Publication Data

US 2024/0063165 A1     Feb. 22, 2024

(51) Int. Cl.
    *H01L 23/00*       (2006.01)
    *C09J 9/02*        (2006.01)
    *H01L 25/065*      (2023.01)

(52) U.S. Cl.
    CPC ............... *H01L 24/32* (2013.01); *C09J 9/02* (2013.01); *H01L 24/29* (2013.01); *H01L 25/0652* (2013.01); *H01L 25/0657* (2013.01); *C09J 2203/326* (2013.01); *C09J 2301/314* (2020.08); *H01L 24/13* (2013.01); *H01L 24/16* (2013.01); *H01L 24/73* (2013.01); *H01L 2224/13193* (2013.01); *H01L 2224/16145* (2013.01); *H01L 2224/29013* (2013.01); *H01L 2224/29076* (2013.01); *H01L 2224/2908* (2013.01); *H01L 2224/2919* (2013.01); *H01L 2224/29193* (2013.01); *H01L 2224/32145* (2013.01); *H01L 2224/73204* (2013.01); *H01L 2225/06513* (2013.01); *H01L 2225/06524* (2013.01); *H01L 2924/07811* (2013.01); *H01L 2924/07812* (2013.01); *H01L 2924/1434* (2013.01)

(58) Field of Classification Search
    CPC .. H01L 24/32; H01L 25/0652; H01L 25/0657
    See application file for complete search history.

(56) References Cited

U.S. PATENT DOCUMENTS

| | | | | |
|---|---|---|---|---|
| 6,238,949 B1* | 5/2001 | Nguyen | ............... | H01L 25/0657 257/E23.125 |
| 2013/0069239 A1* | 3/2013 | Kim | ..................... | H01L 23/5389 257/774 |
| 2013/0119527 A1* | 5/2013 | Luo | ..................... | H01L 25/0657 165/185 |
| 2014/0120356 A1* | 5/2014 | Shearer | ..................... | C09J 5/06 156/60 |

\* cited by examiner

*Primary Examiner* — Dale E Page
*Assistant Examiner* — Wilner Jean Baptiste
(74) *Attorney, Agent, or Firm* — Harrity & Harrity, LLP

(57) ABSTRACT

Implementations described herein relate to various semiconductor device assemblies. In some implementations, an adhesive assembly configured for semiconductor die attachment includes one or more adhesive films capable of semiconductor die attachment, and one or more conductive elements embedded in the one or more adhesive films.

25 Claims, 9 Drawing Sheets

CONDUCTIVE ADHESIVE ASSEMBLY FOR SEMICONDUCTOR DIE ATTACHMENT

TECHNICAL FIELD

The present disclosure generally relates to semiconductor devices and methods of forming semiconductor devices. For example, the present disclosure relates to a conductive adhesive assembly for semiconductor die attachment.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes a mechanism for connecting internal components to external components (e.g., a circuit board), such as via balls, pins, or leads. A semiconductor package is sometimes referred to as a semiconductor device assembly.

DETAILED DESCRIPTION

A semiconductor package may include multiple semiconductor dies in a stacked arrangement to reduce a footprint of the dies. Die attach film (DAF) may be disposed between each of the dies of the stack to provide adhesive attachment between adjacent dies. The semiconductor package may be connected to a circuit board, and in some cases, a heat sink may be connected to the semiconductor package or connected elsewhere on the circuit board. The circuit board and/or the heat sink may facilitate heat dissipation for the dies of the stack.

However, some dies of the stack that are closer to the circuit board and/or the heat sink may experience greater heat dissipation than other dies of the stack that are further away. This is exacerbated because the DAF between dies has high thermal resistance, thereby inhibiting heat transfer through the stack of dies to the circuit board and/or the heat sink. Accordingly, operating temperatures among the dies may vary significantly even if power distribution among the dies is uniform. In some cases, dies further away from the circuit board and/or the heat sink may experience high operating temperatures that may exceed a maximum temperature limit, thereby degrading a performance of the semiconductor dies, causing damage to the semiconductor dies, or the like.

Some implementations described herein are directed to a conductive adhesive assembly, and a method of using the conductive adhesive assembly, that improves heat dissipation and temperature uniformity in a stack of semiconductor dies. For example, the conductive adhesive assembly may include one or more conductive elements (e.g., metal strips) embedded in an adhesive film. A conductive adhesive assembly may be disposed between each of the dies of the stack to provide adhesive attachment between adjacent dies and improved thermal conductivity between adjacent dies. For example, a prior DAF, described above, may have a low thermal conductivity in a range from 0.2 to 0.4 watts per meter-kelvin (W/mK), whereas the conductive adhesive assembly described herein may have a thermal conductivity exceeding 120 W/mK. Thus, using conductive adhesive assemblies, dies of the stack that are further away from a circuit board and/or a heat sink may experience improved heat dissipation via other dies of the stack to thereby achieve operating temperatures safely below a maximum temperature limit. For example, using conductive adhesive assemblies, a maximum operating temperature of the stack of dies, or an assembly including the stack of dies, may be reduced by 4° Celsius or more relative to the use of the prior DAF (e.g., based on an evaluation study of validated thermal models). This may improve a performance of the semiconductor dies, reduce the likelihood of damage to the semiconductor dies, or the like. Moreover, the conductive adhesive assembly described herein facilitates improved heat dissipation and temperature uniformity without increasing a footprint of the stack of dies.

Figure 1:
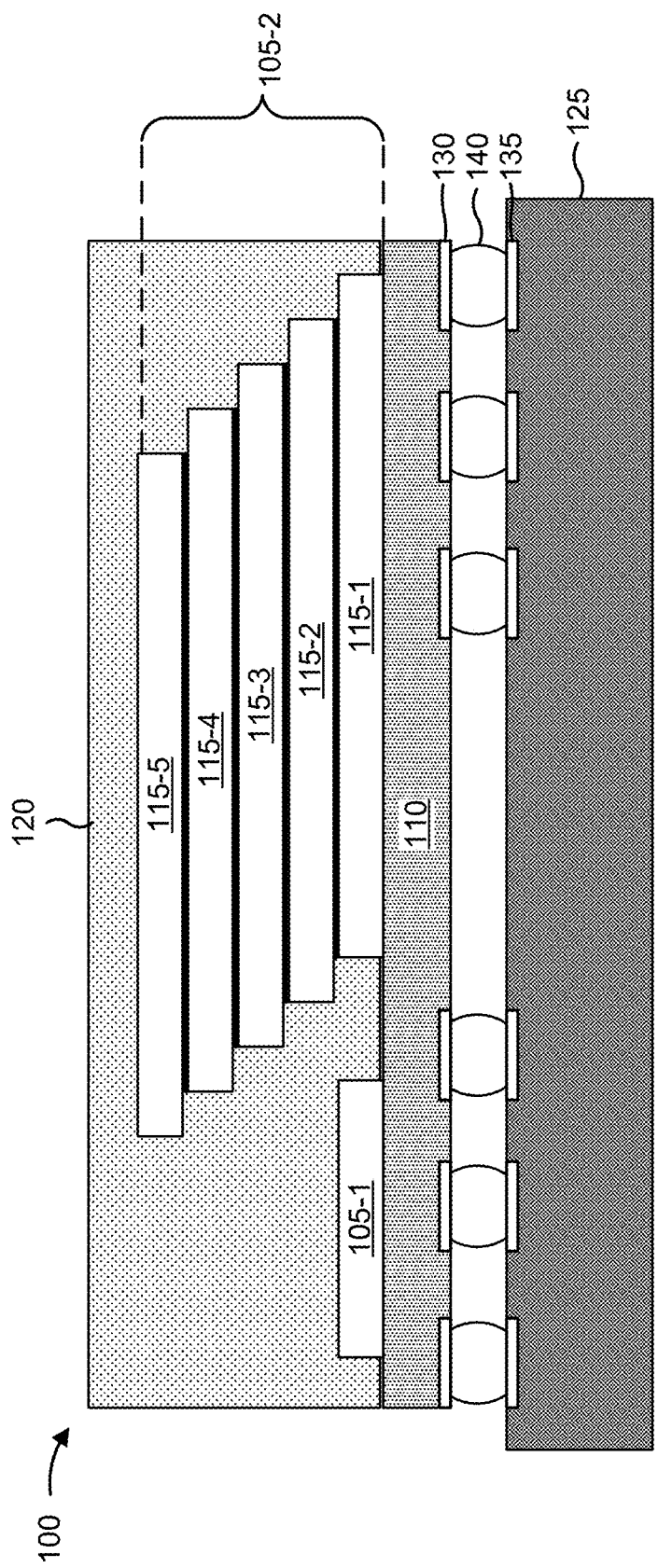
FIG. 1 is a diagram of an example apparatus that may include assemblies described herein.

FIG. 1 is a diagram of an example apparatus 100 that may include assemblies described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other (e.g., with DAF between adjacent dies) to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
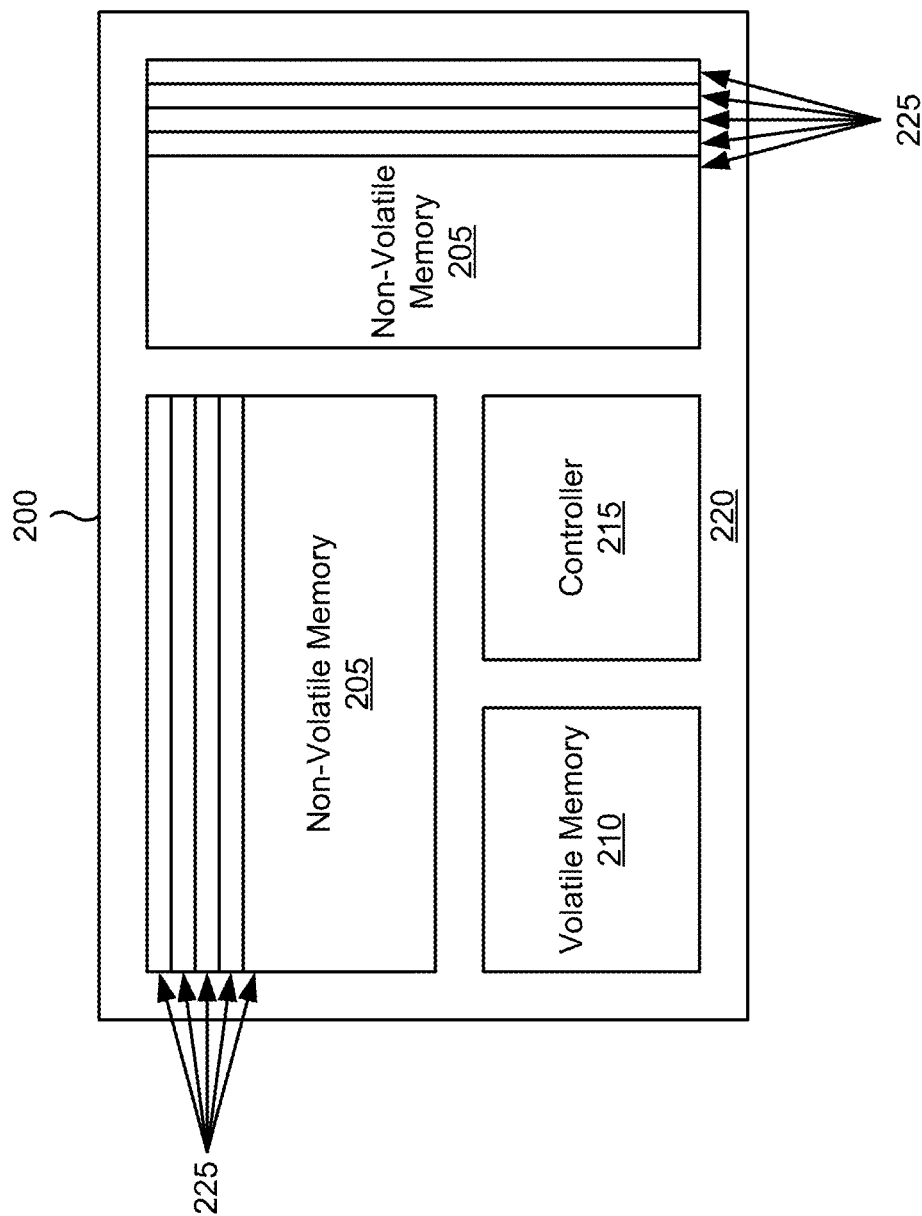
FIG. 2 is a diagram of an example memory device that may include assemblies described herein.

FIG. 2 is a diagram of an example memory device 200 that may include assemblies described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
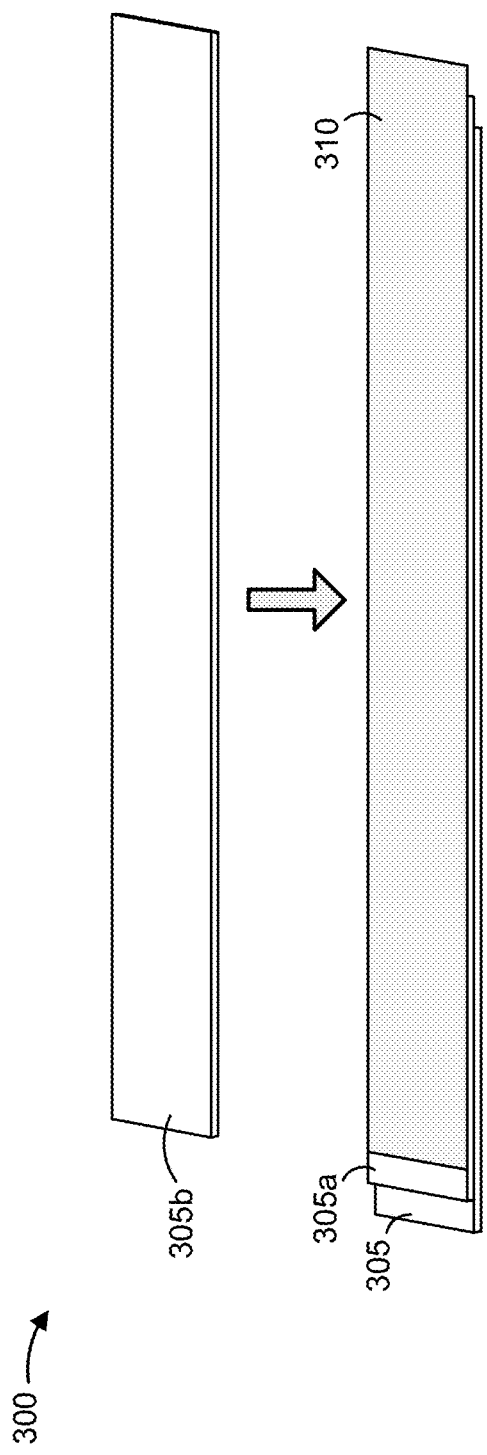
FIG. 3 is a diagram of an example of a stack of semiconductor dies.

FIG. 3 is a diagram of an example of a stack 300 of semiconductor dies 305. As shown, a DAF 310 may be disposed between adjacent dies 305a, 305b of the stack 300. The DAF 310 may join the dies 305a, 305b together. For example, the DAF 310 may adhere a top surface of the die 305a to a bottom surface of the die 305b. The DAF 310 may be an adhesive film that comprises, consists of, or consists essentially of epoxy resin, phenol resin, acrylic rubber, silica filler, or a combination thereof. For example, the DAF 310 may comprise, consist of, or consist essentially of a polyimide adhesive, an epoxy adhesive, and/or an acrylic adhesive, among other examples.

As described above, the DAF 310 may have a low thermal conductivity in a range from 0.2 to 0.4 W/mK. In other words, the DAF 310 may be considered to have relatively high thermal resistivity. Thus, the DAF 310 may be resistive to heat transfer between the dies 305, and therefore resistive to heat transfer from the dies 305 to a circuit board or a heat sink. As a result, the dies 305 of the stack 300 may lack temperature uniformity, with the dies 305 closer to the circuit board and/or the heat sink having relatively lower operating temperatures and the dies 305 further from the circuit board and/or the heat sink having relatively higher operating temperatures. In some cases, these higher operating temperatures may exceed a maximum temperature limit, thereby degrading a performance of the dies 305 or causing damage to the dies 305. Some implementations described herein address these and other issues.

As indicated above, FIG. 3 is provided as an example. Other examples may differ from what is described with regard to FIG. 3.

Figure 4:
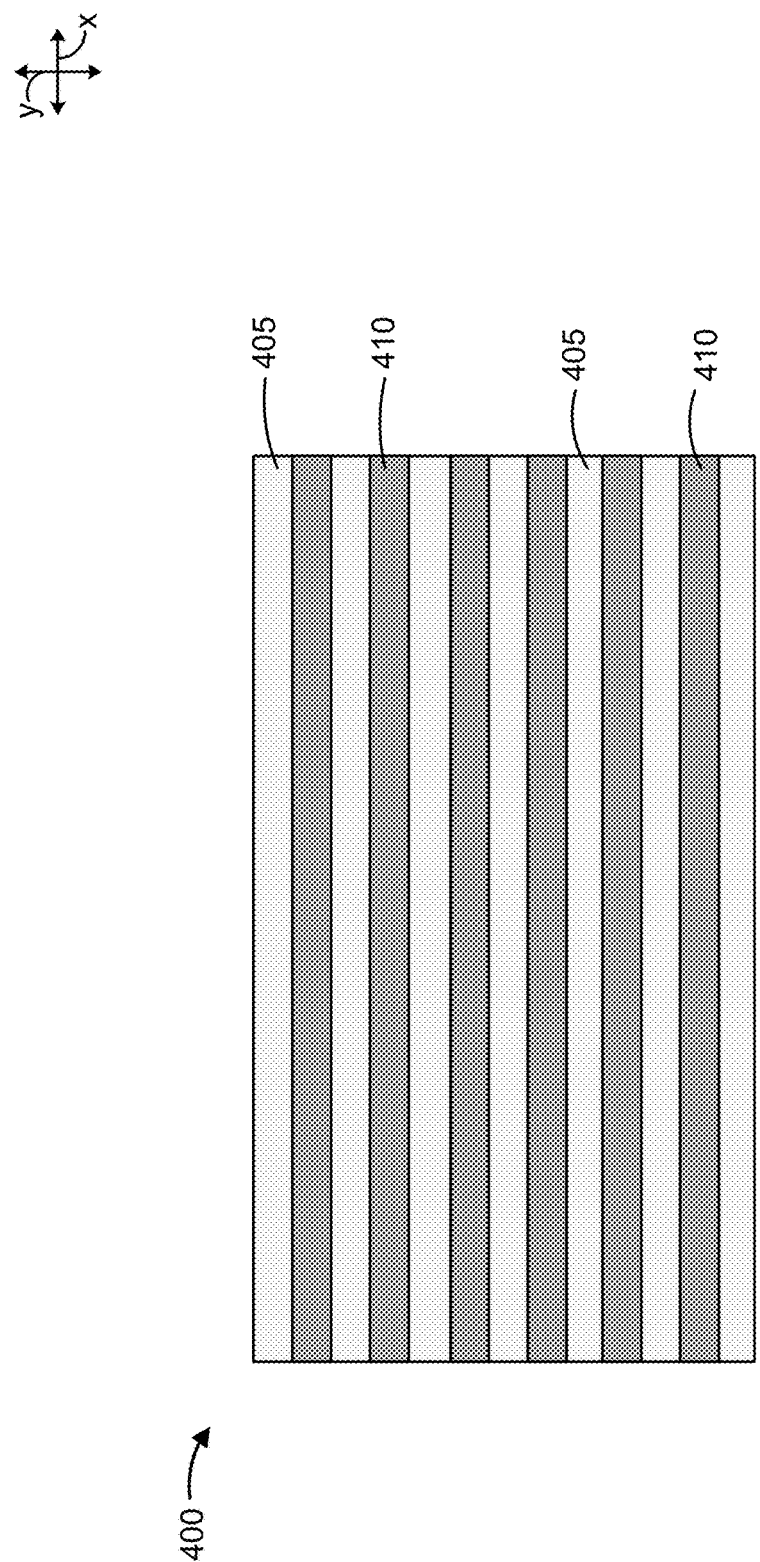
FIG. 4 is a diagram of a top view of an example adhesive assembly.

FIG. 4 is a diagram of a top view of an example adhesive assembly 400. The adhesive assembly 400 may be configured for semiconductor die attachment. For example, the adhesive assembly 400 may include at least one adhesive film 405 capable of semiconductor die attachment. The adhesive film 405 may include a DAF, such as the DAF 310, a film-over-wire (FOW) film, or another type of film or layer capable of semiconductor die attachment. For example, the adhesive film 405 may comprise, consist of, or consist essentially of at least one polymer (e.g., polyimide, an epoxy resin, or the like).

A plurality of conductive elements 410, shown in FIG. 4 as a plurality of conductive strips (e.g., conductive wires), may be joined with the adhesive film 405. For example, the conductive elements 410 may be embedded in the adhesive film 405. In some implementations, the adhesive film 405 and the conductive elements 410 are in an FOW configuration, as described elsewhere herein. In some implementations, the adhesive film 405 may include a first adhesive film and a second adhesive film, and the conductive elements 410 may be disposed between (e.g., sandwiched between) the first adhesive film and the second adhesive film, as described elsewhere herein. Thus, the adhesive assembly 400 may be a composite material, such as a laminated material. In some implementations, the adhesive assembly 400 may have a thickness in a range from approximately 10 micrometers to approximately 40 micrometers, so that an overall footprint of stacked semiconductor dies employing the adhesive assembly 400 is not significantly impacted.

The conductive elements 410 may have high thermal conductivity (e.g., relative to the adhesive film 405). For example, the conductive elements 410 may have a thermal conductivity of at least 100 W/mK, at least 150 W/mK, at least 200 W/mK, at least 300 W/mK, or at least 400 W/mK, among other examples. In some implementations, the conductive elements 410 may comprise, consist of, or consist essentially of graphite (maximum thermal conductivity of 470 W/mK) and/or at least one metal, such as copper (thermal conductivity of 385 W/mK), aluminum (thermal conductivity of 239 W/mK), and/or magnesium (thermal conductivity of 156 W/mK), among other examples.

The conductive elements 410 may occupy from approximately 25% to approximately 75% of a volume of the adhesive assembly 400, such as approximately 50% of the volume of the adhesive assembly 400, and the adhesive film 405 may occupy a remaining volume of the adhesive assembly (e.g., in order to maintain an adhesive property of the adhesive assembly 400). Here, the adhesive assembly 400 may have an overall thermal conductivity of at least 50 W/mK, at least 75 W/mK, at least 100 W/mK, at least 150 W/mK, or at least 200 W/mK. Thermal conductivities at these levels improve thermal transfer between stacked semiconductor dies employing the adhesive assembly 400, as described elsewhere herein. For example, when the conductive elements 410 occupy approximately 50% of the volume of the adhesive assembly 400, the adhesive assembly 400 may have a thermal conductivity of approximately 120 W/mK (e.g., for conductive elements 410 that are aluminum) or approximately 190 W/mK (e.g., for conductive elements 410 that are copper).

As shown, the conductive elements 410 may be arranged in the adhesive assembly 400 spaced from one another (e.g., such that portions of the adhesive film 405 intervene between adjacent conductive elements 410) and extending parallel to one another. However, a different arrangement or pattern for the conductive elements 410 from that shown in FIG. 4 may be used in the adhesive assembly 400, for example, as described in FIGS. 5A-5B. In addition to increasing the thermal conductivity of the adhesive assembly 400, the conductive elements 410 may also provide structural reinforcement of the adhesive assembly 400. In some implementations (e.g., if the adhesive assembly 400 is manufactured separately from a stack of semiconductor dies), a removable (e.g., releasable) liner (e.g., a non-stick liner) may be attached to one or more surfaces of the adhesive assembly 400 to protect adhesive characteristics of the adhesive assembly 400 during transport or handling.

In some implementations, the adhesive assembly 400 may be used in the stack 300 of semiconductor dies 305 in place of the DAF 310.

As indicated above, FIG. 4 is provided as an example. Other examples may differ from what is described with regard to FIG. 4.

Figure 5B:
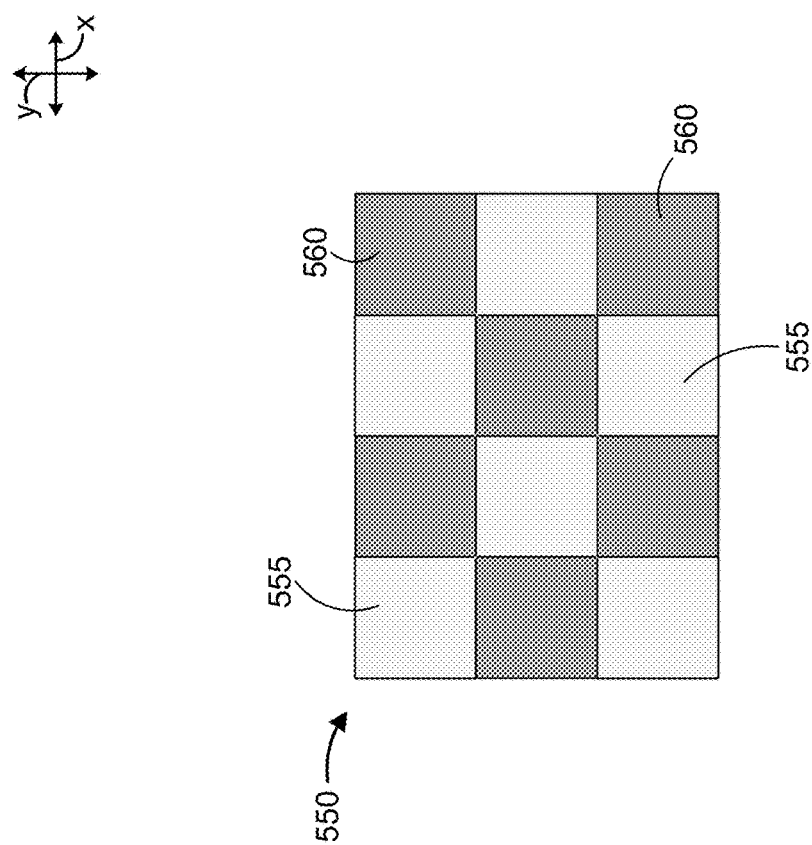
FIG. 5B is a diagram of a top view of an example adhesive assembly.
Figure 5A:
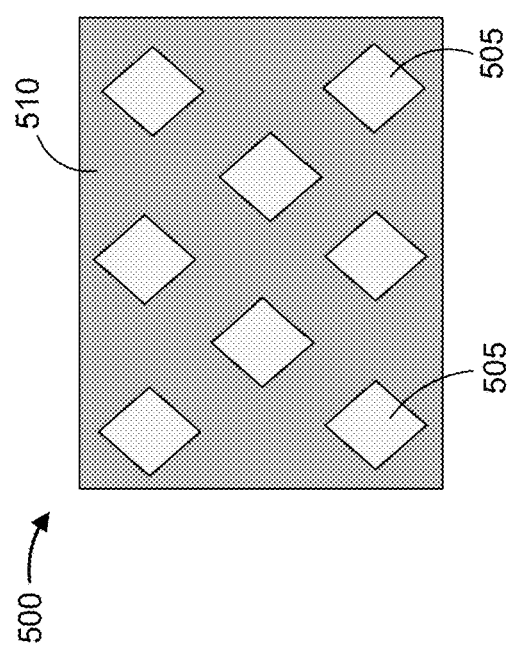
FIG. 5A is a diagram of a top view of an example adhesive assembly.

FIG. 5A is a diagram of a top view of an example adhesive assembly 500. The adhesive assembly 500 may be configured for semiconductor die attachment. For example, the adhesive assembly 500 may include at least one adhesive film 505, in a similar manner as described in connection with FIG. 4. A conductive element 510 may be joined with the adhesive film 505, in a similar manner as described in connection with FIG. 4. For example, the conductive element 510 may be embedded in the adhesive film 505, in a similar manner as described in connection with FIG. 4.

The conductive element 510 is shown in FIG. 5A as a conductive sheet, which may have properties similar to the conductive elements 410 described herein. The conductive sheet may be patterned with one or more openings (e.g., a plurality of openings). For example, the openings in the conductive sheet may be in the shape of diamonds, as shown, or another shape. The openings in the conductive sheet may be arranged in an array of rows and columns, and the openings may be spaced from one another. The openings in the conductive sheet may provide exposure of the adhesive film 505. Moreover, the openings in the conductive sheet may align with exposed circuitry of an adjacent semiconductor die to prevent the conductive sheet from interfering with the circuitry. In some implementations, a removable (e.g., releasable) liner (e.g., a non-stick liner) may be attached to one or more surfaces of the adhesive assembly 500, as described above.

The adhesive assembly 500 may have properties similar to the adhesive assembly 400 described herein. In some implementations, the adhesive assembly 500 may be used in the stack 300 of semiconductor dies 305 in place of the DAF 310.

As indicated above, FIG. 5A is provided as an example. Other examples may differ from what is described with regard to FIG. 5A.

FIG. 5B is a diagram of a top view of an example adhesive assembly 550. The adhesive assembly 550 may be configured for semiconductor die attachment. For example, the adhesive assembly 550 may include at least one adhesive film 555, in a similar manner as described in connection with FIG. 4. A conductive element 560 may be joined with the adhesive film 555, in a similar manner as described in connection with FIG. 4. For example, the conductive element 560 may be embedded in the adhesive film 555, in a similar manner as described in connection with FIG. 4.

The conductive element 560 is shown in FIG. 5B as a conductive sheet, which may have properties similar to the conductive elements 410 described herein. The conductive sheet may be patterned with one or more openings (e.g., a plurality of openings). For example, the openings in the conductive sheet may be arranged in a checker pattern, as shown (e.g., to provide exposure of the adhesive film 555 and/or to align with exposed circuitry of an adjacent semiconductor die). As shown in FIG. 5B, an opening may be partially surrounded or fully surrounded by the conductive sheet. In some implementations, the conductive sheet may be a unitary element. In some implementations, the conductive sheet may be composed of a plurality of individual conductive elements (e.g., that interconnect or that are not connected). In some implementations, a removable (e.g., releasable) liner (e.g., a non-stick liner) may be attached to one or more surfaces of the adhesive assembly 550, as described above.

The adhesive assembly 550 may have properties similar to the adhesive assembly 400 described herein. In some implementations, the adhesive assembly 550 may be used in the stack 300 of semiconductor dies 305 in place of the DAF 310.

As indicated above, FIG. 5B is provided as an example. Other examples may differ from what is described with regard to FIG. 5B.

The arrangement of conductive elements in FIGS. 4, 5A, and 5B are examples, and in practice, any arrangement of conductive elements may be used in an adhesive assembly (e.g., concentric rectangles of conductive elements, diagonal strips of conductive elements, and so forth). Common to the various possible arrangements of conductive elements is that the conductive elements may occupy approximately 25% to approximately 75%, such as approximately 50%, of a volume of an adhesive assembly, as described above.

Figure 6:
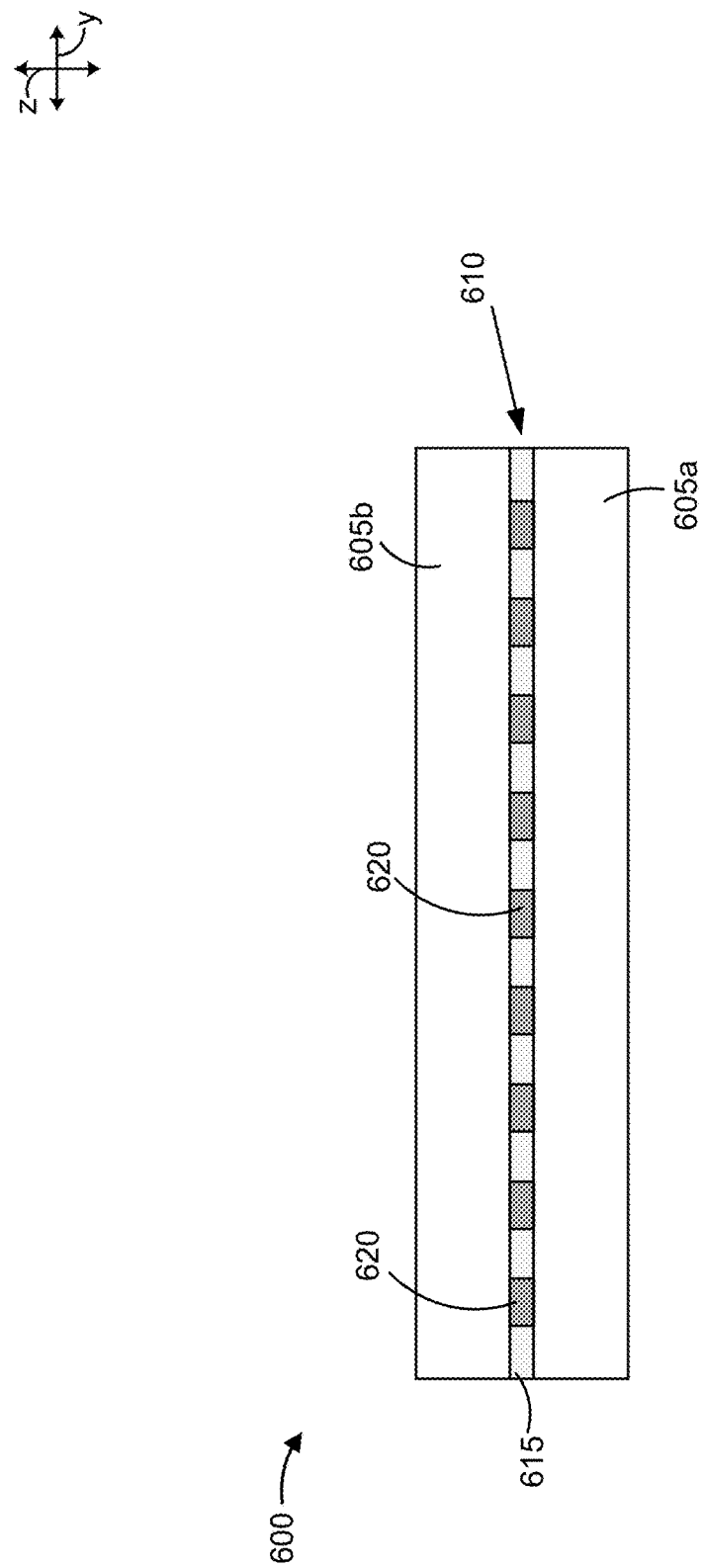
FIG. 6 is a diagram of a side view of an example apparatus that includes an adhesive assembly.

FIG. 6 is a diagram of a side view of an example apparatus 600 that includes an adhesive assembly. The apparatus 600 may be a semiconductor device assembly. The apparatus 600 may include a plurality of semiconductor dies 605 in a stacked arrangement. For example, as shown in FIG. 6, the apparatus 600 may include a first semiconductor die 605*a*, and a second semiconductor die 605*b* in a stacked arrangement with the first semiconductor die 605*a*. The stacked arrangement of the semiconductor dies 605 may be a shingle stacking or another suitable type of stacking. In some implementations, the first semiconductor die 605*a* may be a first memory device and the second semiconductor die 605*b* may be a second memory device, as described herein.

The apparatus 600 may include an adhesive assembly 610 between (e.g., sandwiched between) the first semiconductor die 605*a* and the second semiconductor die 605*b*. The adhesive assembly 610 may correspond to the adhesive assembly 400, 500, or 550. For example, the adhesive assembly 610 may include one or more adhesive films 615 and one or more conductive elements 620 joined with the adhesive film(s) 615.

In some implementations, as shown, the adhesive assembly 610 includes an adhesive film 615 and a plurality of conductive elements 620 (shown as conductive strips, as described in connection with FIG. 4) joined with the adhesive film 615. For example, the conductive elements 620 may be embedded in the adhesive film 615. As shown in FIG. 6, the adhesive film 615 and the conductive elements 620 may be in an FOW configuration (e.g., the adhesive assembly may be manufactured using an FOW technique, in which an FOW film is molded around the conductive elements 620 under heat and/or pressure). In this configuration, the conductive elements 620 may contact at least one of the first semiconductor die 605*a* or the second semiconductor die 605*b* (e.g., may contact both of the first semiconductor die 605*a* and the second semiconductor die 605*b*). Thus, the conductive elements 620 may be arranged in the adhesive assembly 610 so that the conductive elements 620 avoid (e.g., are not aligned with), and exposed areas of the adhesive film 615 align with, exposed circuitry of the first semiconductor die 605*a* and/or the second semiconductor die 605*b*, thereby preventing electrical shorts that may otherwise occur if the conductive elements 620 were to contact the exposed circuitry.

In this way, the adhesive assembly 610, and in particular the conductive elements 620, improves thermal conductivity between the semiconductor dies 605, thereby facilitating thermal transfer from a hotter semiconductor die 605 to a cooler semiconductor die 605 and/or thermal transfer through the stack of semiconductor dies 605 to a circuit board and/or a heat sink for heat dissipation. In some implementations, the apparatus 600 may correspond to the integrated circuit 105-2 used in the apparatus 100, described herein. In some implementations, the apparatus 600 may correspond to the non-volatile memory 205 used in the memory device 200, described herein. Although shown with two semiconductor dies 605 in a stacked arrangement, the apparatus 600 may include three or more semiconductor dies 605 in a stacked arrangement. Here, an adhesive assembly 610 may be disposed between each pair of adjacent semiconductor dies 605 of the apparatus 600.

As indicated above, FIG. 6 is provided as an example. Other examples may differ from what is described with regard to FIG. 6.

Figure 7:
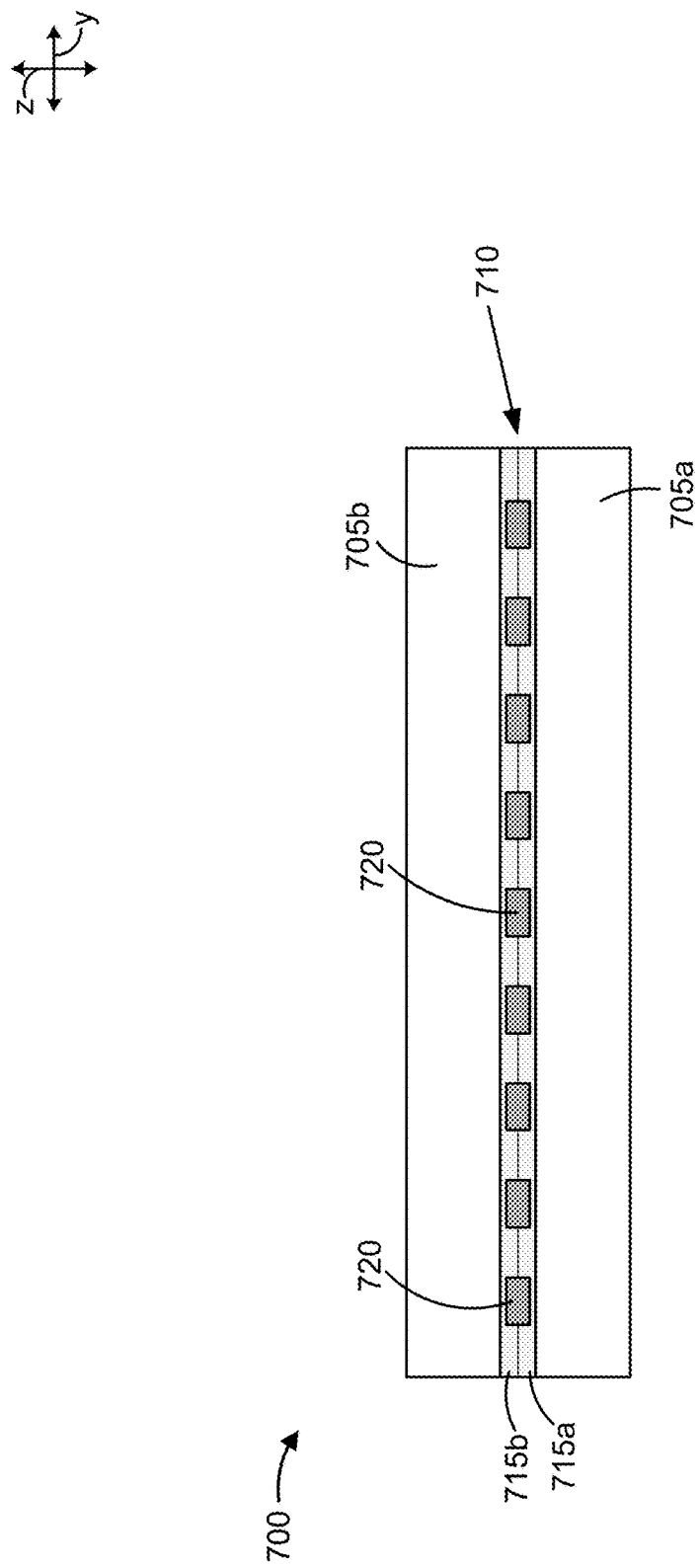
FIG. 7 is a diagram of a side view of an example apparatus that includes an adhesive assembly.

FIG. 7 is a diagram of a side view of an example apparatus 700 that includes an adhesive assembly. The apparatus 700 may be a semiconductor device assembly. The apparatus 700 may include a plurality of semiconductor dies 705 in a stacked arrangement. For example, as shown in FIG. 7, the apparatus 700 may include a first semiconductor die 705*a*, and a second semiconductor die 705*b* in a stacked arrangement with the first semiconductor die 705*a*, in a similar manner as described in connection with FIG. 6. In some implementations, the first semiconductor die 705*a* may be a first memory device and the second semiconductor die 705*b* may be a second memory device, as described herein.

The apparatus 700 may include an adhesive assembly 710 between (e.g., sandwiched between) the first semiconductor die 705*a* and the second semiconductor die 705*b*. The adhesive assembly 710 may correspond to the adhesive assembly 400, 500, or 550. For example, the adhesive assembly 710 may include one or more adhesive films 715 and one or more conductive elements 720 joined with the adhesive film(s) 715.

In some implementations, as shown, the adhesive assembly 710 includes a first adhesive film 715*a*, a second adhesive film 715*b*, and a plurality of conductive elements 720 (shown as conductive strips, as described in connection with FIG. 4) joined with the adhesive films 715. For example, the conductive elements 720 may be embedded in the adhesive films 715 (e.g., and not exposed to a top surface or a bottom surface of the adhesive assembly 710). As shown in FIG. 7, the conductive elements 720 may be disposed between the first adhesive film 715a and the second adhesive film 715b (e.g., the adhesive assembly 710 may be manufactured by applying the conductive elements 720 to the first adhesive film 715a and applying the second adhesive film 715 to the conductive elements 720, as described herein). In this configuration, the adhesive films 715 (e.g., which are very thin layers) may separate the conductive elements 720 from the first semiconductor die 705a and the second semiconductor die 705b, such that the adhesive films 715 contact the semiconductor dies 705 and the conductive elements 720 do not contact the semiconductor dies 705. Thus, the conductive elements 720 may be arranged in the adhesive assembly 710 without regard to (e.g., independent of) locations of exposed circuitry of the first semiconductor die 605a and the second semiconductor die 605b.

In this way, the adhesive assembly 710, and in particular the conductive elements 720, improves thermal conductivity between the semiconductor dies 705, thereby facilitating thermal transfer from a hotter semiconductor die 705 to a cooler semiconductor die 705 and/or thermal transfer through the stack of semiconductor dies 705 to a circuit board and/or a heat sink for heat dissipation. In some implementations, the apparatus 700 may correspond to the integrated circuit 105-2 used in the apparatus 100, described herein. In some implementations, the apparatus 700 may correspond to the non-volatile memory 205 used in the memory device 200, described herein. Although shown with two semiconductor dies 705 in a stacked arrangement, the apparatus 700 may include three or more semiconductor dies 705 in a stacked arrangement. Here, an adhesive assembly 710 may be disposed between each pair of adjacent semiconductor dies 705 of the apparatus 700.

As indicated above, FIG. 7 is provided as an example. Other examples may differ from what is described with regard to FIG. 7.

Figure 8:
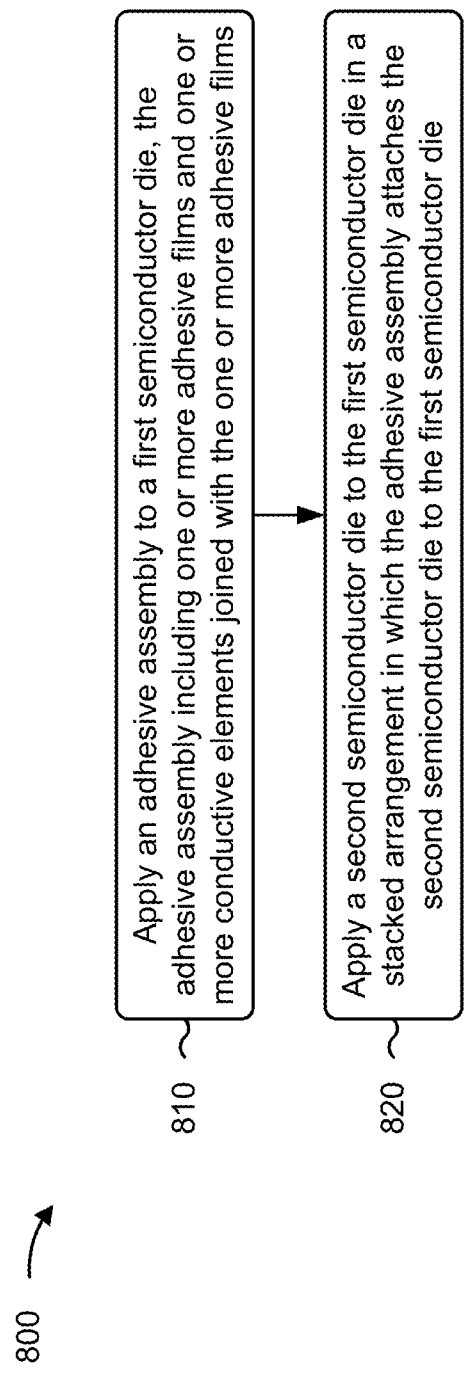
FIG. 8 is a flowchart of an example method of forming an integrated assembly or memory device having a conductive adhesive assembly.

FIG. 8 is a flowchart of an example method 800 of forming an integrated assembly or memory device having a conductive adhesive assembly. In some implementations, one or more process blocks of FIG. 8 may be performed by various semiconductor manufacturing equipment.

As shown in FIG. 8, the method 800 may include applying an adhesive assembly to a first semiconductor die, the adhesive assembly including one or more adhesive films and one or more conductive elements joined with the one or more adhesive films (block 810). As further shown in FIG. 8, the method 800 may include applying a second semiconductor die to the first semiconductor die in a stacked arrangement in which the adhesive assembly attaches the second semiconductor die to the first semiconductor die (block 820).

The method 800 may include additional implementations, such as any single implementation or any combination of implementations described below and/or in connection with one or more other methods described elsewhere herein.

In some implementations, applying the adhesive assembly to the first semiconductor die includes applying the one or more conductive elements on the first semiconductor die, and applying the one or more adhesive films on the one or more conductive elements using an FOW technique.

In some implementations, applying the adhesive assembly to the first semiconductor die includes applying a first adhesive film, of the one or more adhesive films, on the first semiconductor die, applying the one or more conductive elements on the first adhesive film, and applying a second adhesive film, of the one or more adhesive films, on the one or more conductive elements.

In some implementations, the one or more conductive elements contact the first semiconductor die and the second semiconductor die.

Although FIG. 8 shows example blocks of the method 800, in some implementations, the method 800 may include additional blocks, fewer blocks, different blocks, or differently arranged blocks than those depicted in FIG. 8. In some implementations, the method 800 may include forming the structure 600 and/or 700, an integrated assembly that includes the structure 600 and/or 700, any part described herein of the structure 600 and/or 700, and/or any part described herein of an integrated assembly that includes the structure 600 and/or 700. For example, the method 800 may include forming one or more of the parts 400, 500, 550, 610, and/or 710.

Figure 9:
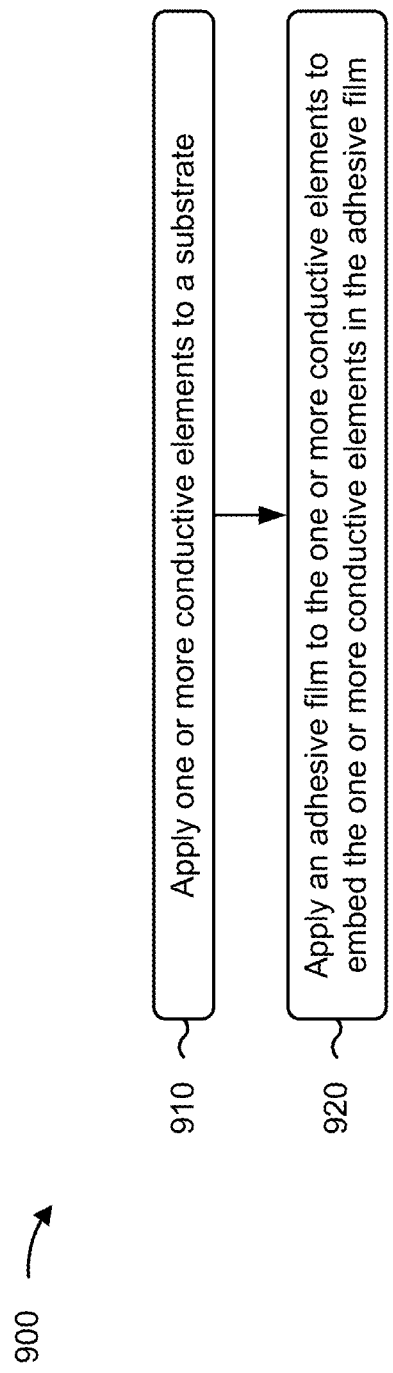
FIG. 9 is a flowchart of an example method of forming a conductive adhesive assembly.

FIG. 9 is a flowchart of an example method 900 of forming a conductive adhesive assembly. In some implementations, one or more process blocks of FIG. 9 may be performed by various semiconductor manufacturing equipment or other manufacturing equipment.

As shown in FIG. 9, the method 900 may include applying one or more conductive elements to a substrate (block 910). As further shown in FIG. 9, the method 900 may include applying an adhesive film to the one or more conductive elements to embed the one or more conductive elements in the adhesive film (block 920).

In some implementations, the substrate is a semiconductor die. In some implementations, the substrate is an additional adhesive film. In some implementations, the additional adhesive film is disposed on a semiconductor die. In some implementations, the substrate is a removable liner.

In some implementations, applying the adhesive film to the one or more conductive elements may include applying the adhesive film to the one or more conductive elements using an FOW technique. For example, according to the FOW technique, the adhesive film may be applied to the one or more conductive elements under heat and/or pressure to cause the adhesive film to mold around the one or more conductive elements.

Although FIG. 9 shows example blocks of the method 900, in some implementations, the method 900 may include additional blocks, fewer blocks, different blocks, or differently arranged blocks than those depicted in FIG. 9. In some implementations, the method 900 may include forming the structure 400, 500, 550, 610, and/or 710, an integrated assembly that includes the structure 400, 500, 550, 610, and/or 710, any part described herein of the structure 400, 500, 550, 610, and/or 710, and/or any part described herein of an integrated assembly that includes the structure 400, 500, 550, 610, and/or 710. For example, the method 900 may include forming one or more of the parts 405, 410, 505, 510, 555, 560, 615, 620, 715, and/or 720.

In some implementations, a semiconductor device assembly includes a first semiconductor die; a second semiconductor die in a stacked arrangement with the first semiconductor die; and an adhesive assembly, between the first semiconductor die and the second semiconductor die, including: one or more adhesive films; and one or more conductive elements joined with the one or more adhesive films.

In some implementations, an adhesive assembly configured for semiconductor die attachment includes one or more adhesive films capable of semiconductor die attachment; and one or more conductive elements embedded in the one or more adhesive films.

In some implementations, a method includes applying an adhesive assembly to a first semiconductor die, the adhesive assembly including one or more adhesive films and one or more conductive elements joined with the one or more adhesive films; and applying a second semiconductor die to the first semiconductor die in a stacked arrangement in which the adhesive assembly attaches the second semiconductor die to the first semiconductor die.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:
   a first semiconductor die;
   a second semiconductor die in a stacked arrangement with the first semiconductor die; and
   an adhesive assembly, between the first semiconductor die and the second semiconductor die, comprising:
      one or more adhesive films; and
      one or more conductive elements joined with the one or more adhesive films,
      wherein the one or more adhesive films prevent contact between the one or more conductive elements and the first semiconductor die and prevent contact between the one or more conductive elements and the second semiconductor die.

2. The semiconductor device assembly of claim 1, wherein the one or more conductive elements are embedded in the one or more adhesive films.

3. The semiconductor device assembly of claim 2, wherein the one or more adhesive films and the one or more conductive elements are in a film-over-wire configuration.

4. The semiconductor device assembly of claim 2, wherein the one or more adhesive films comprise a first adhesive film and a second adhesive film, and
   wherein the one or more conductive elements are disposed between the first adhesive film and the second adhesive film.

5. The semiconductor device assembly of claim 1, wherein the one or more conductive elements comprise a plurality of conductive strips.

6. The semiconductor device assembly of claim 1, wherein the one or more conductive elements comprise a conductive sheet.

7. The semiconductor device assembly of claim 6, wherein the conductive sheet is patterned with one or more openings.

8. The semiconductor device assembly of claim 1, wherein the first semiconductor die comprises a first memory device and the second semiconductor die comprises a second memory device.

9. The semiconductor device assembly of claim 1, wherein the stacked arrangement of the first semiconductor die and the second semiconductor die is a shingle stacking.

10. The semiconductor device assembly of claim 1, wherein the one or more conductive elements occupy from 25% to 75% of a volume of the adhesive assembly.

11. The semiconductor device assembly of claim 1, wherein the one or more conductive elements are arranged in the adhesive assembly independent of circuitry of the first semiconductor die and independent of circuitry of the second semiconductor die.

12. The semiconductor device assembly of claim 1, wherein the one or more conductive elements are not exposed to a top surface or a bottom surface of the adhesive assembly.

13. A method, comprising:
applying an adhesive assembly to a first semiconductor die, the adhesive assembly including one or more adhesive films and one or more conductive elements joined with the one or more adhesive films,
wherein the one or more adhesive films prevent contact between the one or more conductive elements and the first semiconductor die and prevent contact between the one or more conductive elements and a second semiconductor die; and
applying the second semiconductor die to the first semiconductor die in a stacked arrangement in which the adhesive assembly attaches the second semiconductor die to the first semiconductor die.

14. An adhesive assembly configured for semiconductor die attachment, comprising:
one or more adhesive films capable of semiconductor die attachment; and
one or more conductive elements embedded in the one or more adhesive films,
wherein the one or more adhesive films prevent contact between the one or more conductive elements and one or more semiconductor dies.

15. The adhesive assembly of claim 14, wherein the one or more adhesive films and the one or more conductive elements are in a film-over-wire configuration.

16. The adhesive assembly of claim 14, wherein the one or more adhesive films comprise a first adhesive film and a second adhesive film, and
wherein the one or more conductive elements are disposed between the first adhesive film and the second adhesive film.

17. The adhesive assembly of claim 14, wherein the one or more conductive elements comprise a plurality of conductive strips.

18. The adhesive assembly of claim 14, wherein the one or more conductive elements comprise a conductive sheet.

19. The adhesive assembly of claim 18, wherein the conductive sheet is patterned with one or more openings.

20. The adhesive assembly of claim 14, wherein the adhesive assembly has a thickness in a range from 10 micrometers to 40 micrometers.

21. The adhesive assembly of claim 14, wherein the one or more conductive elements comprise, consist of, or consist essentially of graphite or at least one metal, and
wherein the one or more adhesive films comprise, consist of, or consist essentially of at least one polymer.

22. The adhesive assembly of claim 14, wherein the one or more conductive elements occupy from 25% to 75% of a volume of the adhesive assembly.

23. The method of claim 13, wherein the one or more conductive elements are embedded in the one or more adhesive films independent of circuitry of the first semiconductor die and independent of circuitry of the second semiconductor die.

24. The method of claim 13, wherein applying the adhesive assembly to the first semiconductor die comprises:
applying the one or more conductive elements on the first semiconductor die; and
applying the one or more adhesive films on the one or more conductive elements using a film-over-wire technique.

25. The method of claim 13, wherein applying the adhesive assembly to the first semiconductor die comprises:
applying a first adhesive film, of the one or more adhesive films, on the first semiconductor die;
applying the one or more conductive elements on the first adhesive film; and
applying a second adhesive film, of the one or more adhesive films, on the one or more conductive elements.

* * * * *